(12) United States Patent
Liao et al.

(10) Patent No.: US 10,510,427 B2
(45) Date of Patent: Dec. 17, 2019

(54) HIGH RELIABLE OTP MEMORY WITH LOW READING VOLTAGE

(71) Applicant: SICHUAN KILOWAY ELECTRONICS INC., Mianyang (CN)

(72) Inventors: Xuyang Liao, Chengdu (CN); Junhua Mao, Chengdu (CN); Jack Z. Peng, Chengdu (CN)

(73) Assignee: SICHUAN KILOWAY ELECTRONICS INC., Mianyang (CN)

( * ) Notice: Subject to any disclaimer, the term of this patent is extended or adjusted under 35 U.S.C. 154(b) by 0 days.

(21) Appl. No.: 16/075,980

(22) PCT Filed: Feb. 18, 2016

(86) PCT No.: PCT/CN2016/074007
§ 371 (c)(1),
(2) Date: Aug. 6, 2018

(87) PCT Pub. No.: WO2017/133026
PCT Pub. Date: Aug. 10, 2017

(65) Prior Publication Data
US 2019/0341119 A1    Nov. 7, 2019

(30) Foreign Application Priority Data
Feb. 5, 2016   (CN) .......................... 2016 1 0084553

(51) Int. Cl.
*G11C 17/16*     (2006.01)
*G11C 5/02*      (2006.01)
(Continued)

(52) U.S. Cl.
CPC .............. *G11C 17/16* (2013.01); *G11C 17/18* (2013.01); *G11C 5/02* (2013.01); *G11C 5/025* (2013.01);
(Continued)

(58) Field of Classification Search
CPC ....... G11C 17/16; G11C 17/18; G11C 17/165; G11C 5/025; G11C 5/02; H01L 27/11206; H01L 23/5252
(Continued)

(56) References Cited

U.S. PATENT DOCUMENTS

2008/0117660 A1* 5/2008 Xu ......................... G11C 17/16
365/96
2012/0163072 A1* 6/2012 Lu ......................... G11C 17/16
365/182
(Continued)

FOREIGN PATENT DOCUMENTS

| CN | 102646450 A | 8/2012 |
|---|---|---|
| CN | 103119657 A | 5/2013 |

(Continued)

*Primary Examiner* — Ly D Pham
(74) *Attorney, Agent, or Firm* — Gokalp Bayramoglu

(57) ABSTRACT

The present invention relates to the technical field of integrated circuits. Disclosed is a one-time programmable memory with a high reliability and a low reading voltage, comprising: a first MOS transistor, a second MOS transistor, and an antifuse component. A gate terminal of the first MOS transistor is connected to a second connecting line (WS), a first connection terminal of the first MOS transistor is connected to the antifuse component, the antifuse component is connected to a first connecting line (WP), and a second connection terminal of the first MOS transistor is connected to a third connecting line (BL). A first connection terminal of the second MOS transistor is connected to a fourth connecting line (BR), and a second connection terminal of the second MOS transistor is connected to a third (Continued)

connecting line (BL). The invention further comprises a voltage limiting device with a control terminal and two connection terminals.

5 Claims, 3 Drawing Sheets

(51) Int. Cl.
  *G11C 5/06* (2006.01)
  *G11C 17/18* (2006.01)
  *H01L 23/525* (2006.01)
  *H01L 27/112* (2006.01)
(52) U.S. Cl.
  CPC ........ *G11C 17/165* (2013.01); *H01L 23/5252* (2013.01); *H01L 27/11206* (2013.01)
(58) Field of Classification Search
  USPC .................................................... 365/96, 51
  See application file for complete search history.

(56) References Cited

U.S. PATENT DOCUMENTS

| | | | | |
|---|---|---|---|---|
| 2013/0063999 | A1* | 3/2013 | Agam | G11C 17/16 365/104 |
| 2014/0218110 | A1* | 8/2014 | Wu | G11C 16/26 330/252 |
| 2014/0225178 | A1* | 8/2014 | Agam | H01L 23/5252 257/314 |

FOREIGN PATENT DOCUMENTS

| | | |
|---|---|---|
| CN | 103219046 A | 7/2013 |
| CN | 203325475 U | 12/2013 |
| CN | 106024064 A | 10/2016 |
| JP | 2004199824 A | 7/2004 |

\* cited by examiner

HIGH RELIABLE OTP MEMORY WITH LOW READING VOLTAGE

CROSS REFERENCE TO RELATED APPLICATION

This application is the national phase entry of International Application PCT/CN2016/074007, filed on Feb. 18, 2016, which is based upon and claims priority to Chinese Patent Application No. 201610084553.9, filed on Feb. 5, 2016, the entire contents of which are incorporated herein by reference.

TECHNICAL FIELD

The present disclosure is directed to the integrated circuits technology. More particularly, the present disclosure is directed to the field of non-volatile memory cells, applied as the high reliable one-time programmable (OTP) memory cells and array with low reading voltage and low power consumption, which is the kernel element in the high frequency and ultra high frequency RFID (Radio Frequency Identification).

BACKGROUND

The Chinese Patent No. 201080067067.7 discloses a low voltage, low power memory. The memory cell shows in the FIG. 1, and the memory array in the FIG. 2.

For the Prior art memory array in FIG. 2, the voltages for programming and reading of cell A are listed in the Table I.

TABLE 1

|  | Cell | V (WP) | V (WS) | V (BL) | V (BR) |
|---|---|---|---|---|---|
| Programming | A SW/SB | 5.5 V | 2.5 V | 0 V | Floating |
|  | B SW/UB | 5.5 V | 2.5 V | 2.5 V | Floating |
|  | C UW/SB | 2.5 V | 0 V | 0 V | Floating |
|  | D UW/UB | 2.5 V | 0 V | 2.5 V | Floating |
| Read | A SW/SB | 1.0 V | 0 V | 0 V | V Sensing |
|  | B SW/UB | 1.0 V | 0 V | Floating | Floating |
|  | C UW/SB | 0 V | 0 V | 0 V | V Sensing |
|  | D UW/UB | 0 V | 0 V | Floating | Floating |

SW: Selected Word line,
SB: Selected Bit line,
UW: Unselected Word line,
UB: Unselected Bit line, As an example, if the Cell B with Row m and Column t has been programmed, and the sequent programming is for the Cell A of Row m and Column s. During the programming of Cell A, the high voltage of Vpp on the WPm causes a high voltage about (Vpp−Vt) at the Grate gmt. Vt is a small voltage difference on the anti-fuse element Cmt of programmed Cell B. The high voltage at the Grate gmt may cause same damage and leakage of the MOS transistor NMt of Cell B, and the reading of Cell B through Sense Amplifier may have some problem.

The above analysis shows the obvious shortage of the prior art.

Since cell B has been programmed, the anti-fuse element is in the condition of conducting.

During the programming of Cell A, the second MOS transistor of Cell B has the operation condition that the gate voltage about 5.5V (i.e. 5.2V), the source voltage and the gain voltage are 2.5V. Therefore, the voltage about 3V is on the gate oxide layer of the second MOS transistor. The damage and degeneration will increase for such MOS transistor, which normally works at the operation voltage of 1.8V or even less.

There is a need in the art for an OTP cell that can achieve improved performance and remedy the deficiencies in the prior art by limiting of the gate voltage of the second MOS transistor.

SUMMARY

This invent discloses an improved OTP cells to solve the problem of high voltage struck in the prior art OTP cells.

FIG. 3 shows the technical scheme of this invent. The new structure of high reliable, low reading voltage OTP memory cell comprises the first MOS transistor (1), the second MOS transistor (2) and the anti-fuse element (4).

The gate of the first MOS transistor is connected to the second line WS, the first end of the first MOS transistor is connected to the first line WP across through the anti-fuse element, and the second end of the first MOS transistor is connected to the third line BL.

The first end of the second MOS transistor is connected to the fourth line BR, the second end is connected to the third line BL.

In the new structure of FIG. 3, there is a voltage-limit device (3), which has one control end and two connection ends. The control end of the voltage-limit device is connected to the control line WB. One of the connection end of device (3) is connected to the anti-fuse element and the end of the first MOS transistor. The other connection end of device (3) is connected to the gate of the second MOS transistor.

The voltage-limit device is the third MOS transistor (3).

The first end of the first MOS transistor is the drain, and the second end is the source.

The first end of the second MOS transistor is the drain, and the second end is the source.

The first end of the third MOS transistor is the drain, and the second end is the source.

All of the first MOS transistor, the second MOS transistor and the third MOS transistor are N-type transistors (NMOS). In the other embodiment, all of them are P-type transistors (PMOS).

All of the first MOS transistor, the second MOS transistor and the third MOS transistor are symmetrical.

This invent solves the problem of the damage and degeneration of devices in the prior art technologies. For the gate of MOS 2, there is no damage, degeneration or leakage caused by the struck of high voltage. The reliability is improved.

DETAILED DESCRIPTION OF THE EMBODIMENTS

Figure 1:
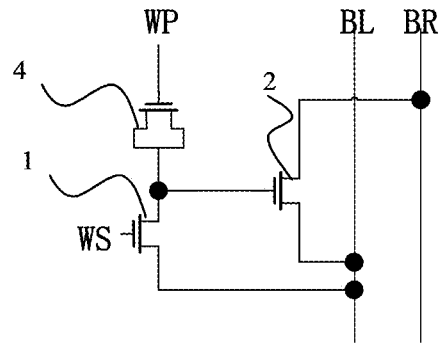
FIG. 1 shows a prior art memory cell.
Figure 2:
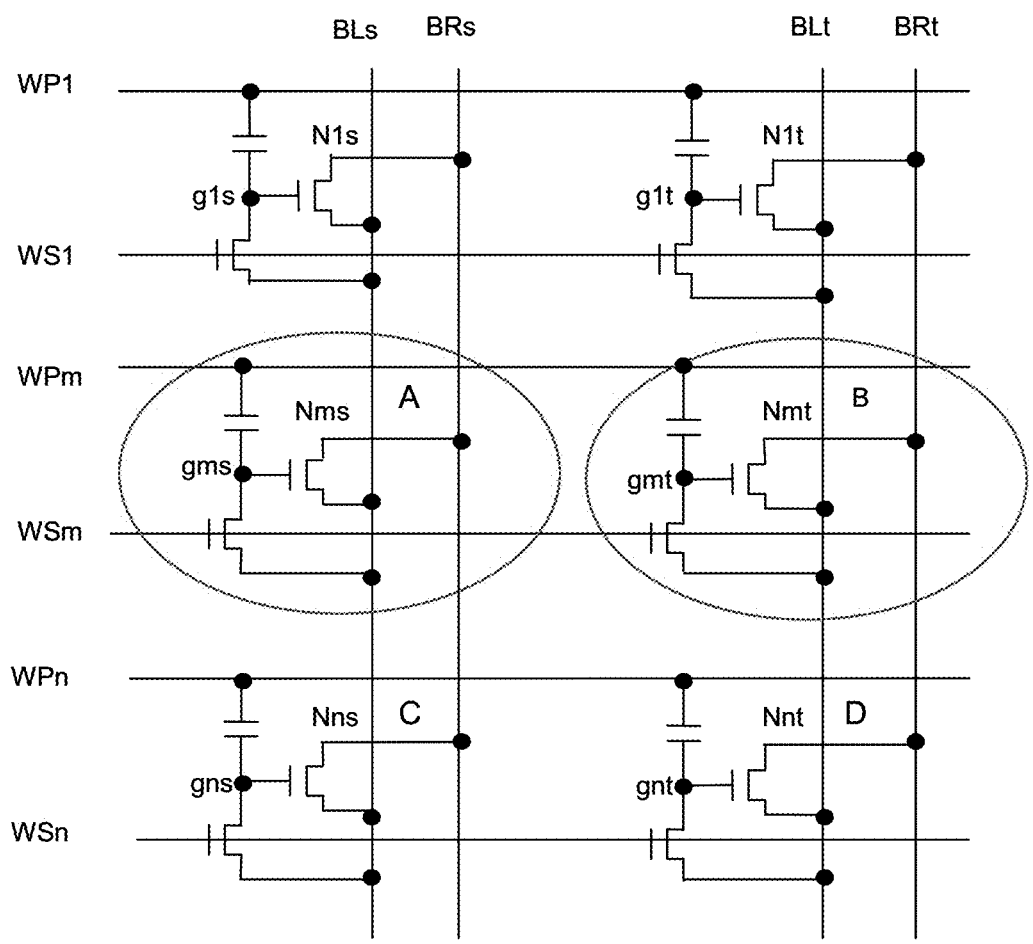
FIG. 2 shows a number of prior art memory cells in the cell array architecture.
Figure 3:
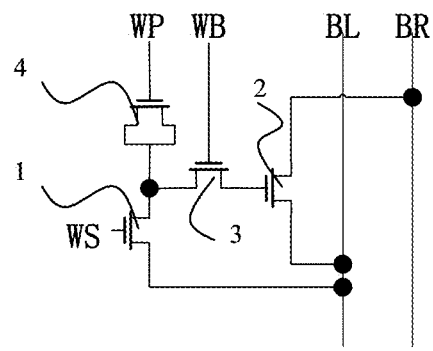
FIG. 3 shows a memory cell of EMBODIMENT 1, according to the present disclosure

EMBODIMENT 1 is shown in FIG. 3.

The high reliable, low reading voltage OTP memory cell comprises the first MOS transistor (1), the second MOS transistor (2) and the anti-fuse element (4).

The gate of the first MOS transistor is connected to the second line WS, the first end of the first MOS transistor is connected to the first line WP across through the anti-fuse element, and the second end of the first MOS transistor is connected to the third line BL.

The first end of the second MOS transistor is connected to the fourth line BR, the second end is connected to the third line BL.

In the new structure of FIG. 3, there is a voltage-limit device (3), which has one control end and two connection ends. The control end of the voltage-limit device is connected to the control line WB. One of the connection end of device (3) is connected to the anti-fuse element (4) and one end of the first MOS transistor, And the other connection end of device (3) is connected to the gate of the second MOS transistor.

The voltage-limit device is the third MOS transistor (3).

The first end of the first MOS transistor is the drain, and the second end is the source.

The first end of the second MOS transistor is the drain, and the second end is the source.

The first end of the third MOS transistor is the drain, and the second end is the source.

All of the first MOS transistor, the second MOS transistor and the third MOS transistor are N-type transistors (NMOS). In the other embodiment, all of them are P-type transistors (PMOS).

All of the MOS transistors of this embodiment are symmetrical. The drain and the source are mutual exchangeable, so that the connection end of the MOS transistor can be either source or drain. The control end of the MOS transistor is the gate.

The third MOS transistor is in the status of "ON", and an appropriate voltage at the gate can limit the gate voltage of the second MOS transistor.

Figure 4:
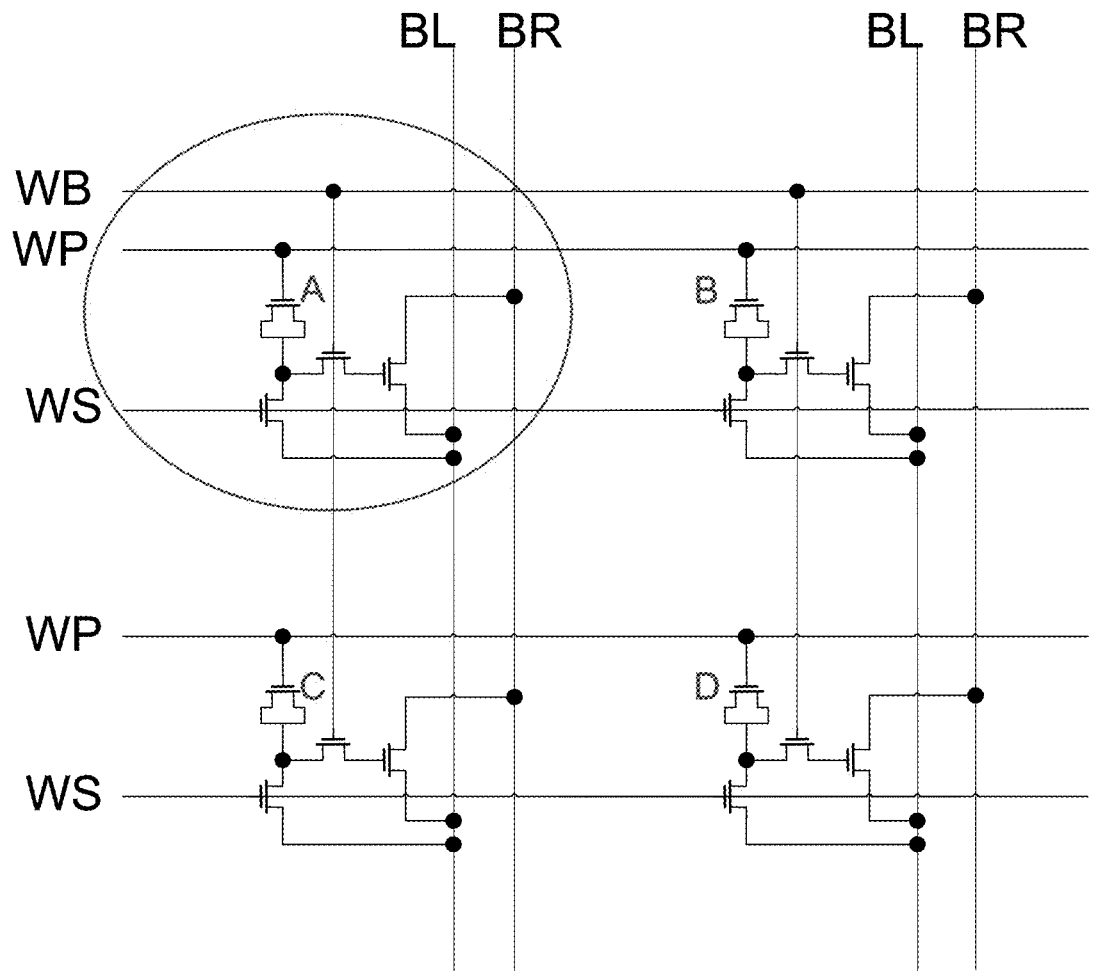
FIG. 4 shows memory cells of FIG. 3 in the cell array architecture.

The structure of memory array shown in FIG. 4 consists in the EMBODIMENT 1 of FIG. 3.

For the memory array of FIG. 4, the voltages for programming and reading of cell A are listed in the Table II.

As listed in Table II, since Cell B has been programmed, during the programming of Cell A, the third MOS transistor of Cell B is used for protecting of the second MOS transistor of Cell B. In more details, if Cell B has been programmed, the anti-fuse element of Cell B is in the "conductive" status. During the programming of Cell A, the ends of the second MOS transistor in Cell B have the voltage status that 2V of gate, 2.5V of both source and drain, respectively. Comparing to the voltages of prior art, such as 5.2V stated in the section of "BACKGROUND", the voltage compression at the gate oxide layer of the second MOS transistor of Cell B reduced significantly. The gate oxide of the second MOS of Cell B is not affected by the high voltage of programming of Cell A.

Figure 5:
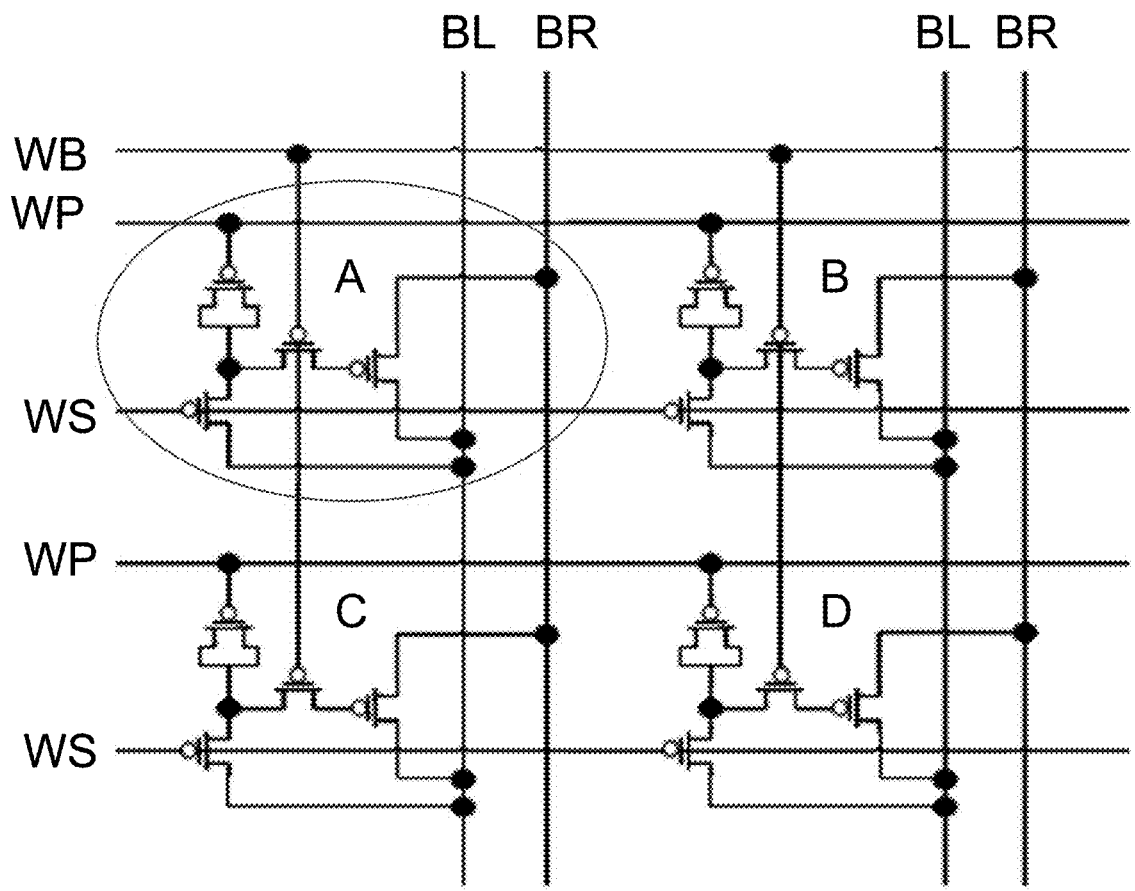
FIG. 5 shows the memory cells in the cell array architecture for EMBODIMENT 2, according to the present disclosure.

EMBODIMENT 2 is shown in FIG. 5.

The difference from EMBODIMENT 1 is that EMBODIMENT 2 consists of PMOS transistors. For the programming and read of Cell A, the voltages in the array of FIG. 5. are listed in Table III.

TABLE III

| | Cell | V(WP) | V(WS) | V(WB) | V(BL) | V(BR) |
|---|---|---|---|---|---|---|
| Programming | A SW/SB | −5.5 V | −2.5 V | −2.5 V | 0 V | Floating |
| | B SW/UB | −5.5 V | −2.5 V | −2.5 V | −2.5 V | Floating |
| | C UW/SB | −2.5 V | 0 V | −2.5 V | 0 V | Floating |
| | D UW/UB | −2.5 V | 0 V | −2.5 V | −2.5 V | Floating |
| Read | A SW/SB | 1 V | 1 V, Pulse | 0 V | 0 V | V Sencing |
| | B SW/UB | 1 V | 1 V, Pulse | 0 V | Floating | 0 V, Floating |
| | C UW/SB | 0 V | 1 V, Pulse | 0 V | 0 V | V Sencing |
| | D UW/UB | 0 V | 1 V, Pulse | 0 V | Floating | 0 V, Floating |

What is claimed is:

1. A high reliable, low reading voltage OTP memory, comprising: a first MOS transistor, a second MOS transistor and an anti-fuse element; wherein
   a gate of the first MOS transistor is connected to a second line WS, a first end of the first MOS transistor is connected to a first line WP across through the anti-fuse element, and a second end of the first MOS transistor is connected to a third line BL;
   a first end of the second MOS transistor is connected to a fourth line BR, a second end of the second MOS transistor is connected to the third line BL;
   the high reliable, low reading voltage OTP memory further comprises a voltage-limit device having one control end and two connection ends; the control end of the voltage-limit device is connected to a control line WB, a first connection end of the voltage-limit device is connected to the anti-fuse element and the first end of the first MOS transistor, and a second connection end of the voltage-limit device is connected to a gate of the second MOS transistor.

TABLE II

| | Cell | V(WP) | V(WS) | V(WB) | V(BL) | V(BR) |
|---|---|---|---|---|---|---|
| Programming | A SW/SB | 5.5 V | 2.5 V | 2.5 V | 0 V | Floating |
| | B SW/UB | 5.5 V | 2.5 V | 2.5 V | 2.5 V | Floating |
| | C UW/SB | 2.5 V | 0 V | 2.5 V | 0 V | Floating |
| | D UW/UB | 2.5 V | 0 V | 2.5 V | 2.5 V | Floating |
| Read | A SW/SB | 1.0 V | Pulse, 0 V | 1 V | 0 V | V Sensing |
| | B SW/UB | 1.0 V | Pulse, 0 V | 1 V | V, Floating | 0 V, Floating |
| | C UW/SB | 0 V | 0 V | 1 V | 0 V | V Sensing |
| | D UW/UB | 0 V | 0 V | 1 V | V, Floating | 0 V, Floating |

2. The high reliable, low reading voltage OTP memory of claim 1, wherein the voltage-limit device is a third MOS transistor.

3. The high reliable, low reading voltage OTP memory of claim 2, wherein the first end of the first MOS transistor is a first drain, and the second end of the first MOS transistor is a first source, the first end of the second MOS transistor is a second drain, and the second end of the second MOS transistor is a second source, a first end of the third MOS transistor is a third drain, and a second end of the third MOS transistor is a third source.

4. The high reliable, low reading voltage OTP memory of claim 2, wherein all of the first MOS transistor, the second MOS transistor and the third MOS transistor are N-type transistors (NMOS) or P-type transistors (PMOS).

5. The high reliable, low reading voltage OTP memory of claim 2, wherein all of the first MOS transistor, the second MOS transistor and the third MOS transistor are symmetrical MOS transistors.

* * * * *